United States Patent [19]

Dahlberg

[11] 4,390,743
[45] Jun. 28, 1983

[54] SILICON LAYER SOLAR CELL AND METHOD OF PRODUCING IT

[75] Inventor: Reinhard Dahlberg, Flein, Fed. Rep. of Germany

[73] Assignee: Licentia Patent Verwaltungs-GmbH, Frankfurt am Main, Fed. Rep. of Germany

[21] Appl. No.: 301,322

[22] Filed: Sep. 11, 1981

[30] Foreign Application Priority Data

Sep. 20, 1980 [DE] Fed. Rep. of Germany ....... 3035563

[51] Int. Cl.³ .......................................... H01L 31/18
[52] U.S. Cl. ..................................... 136/258; 29/572; 427/74; 427/86
[58] Field of Search .......................... 136/258 PC, 261; 29/572; 148/1.5; 427/74, 86, 34

[56] References Cited

U.S. PATENT DOCUMENTS 2,462,906 3/1949 Sauerborn .
4,124,411 11/1978 Meuleman et al. ................ 136/258
4,330,358 5/1982 Grabmaier et al. ................ 156/603

FOREIGN PATENT DOCUMENTS 1273083 7/1968 Fed. Rep. of Germany .
2326156 12/1974 Fed. Rep. of Germany ...... 136/258
55-140278 11/1980 Japan ................................... 136/258

OTHER PUBLICATIONS

Chu et al, Solid-State Electronics, 1976, vol. 19, pp. 837-841.
Velde et al, Phillips Technische Rundschau, vol. 29, Nr. 9/10, pp. 270-274.
Material Engineering, Oct. 1979, p. 6.
VDI-Nachrichten, 22.8.80, Nr. 34, p. 6.

Primary Examiner—Aaron Weisstuch
Attorney, Agent, or Firm—Spencer & Kaye

[57] ABSTRACT

A silicon layer solar cell comprises a low resistance silicon substrate produced by powder metallurgy, to which an active silicon layer is applied. The invention also includes a method of producing such a solar cell.

16 Claims, 5 Drawing Figures

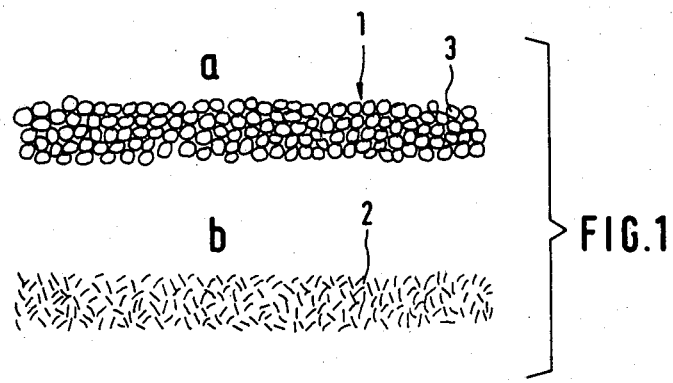
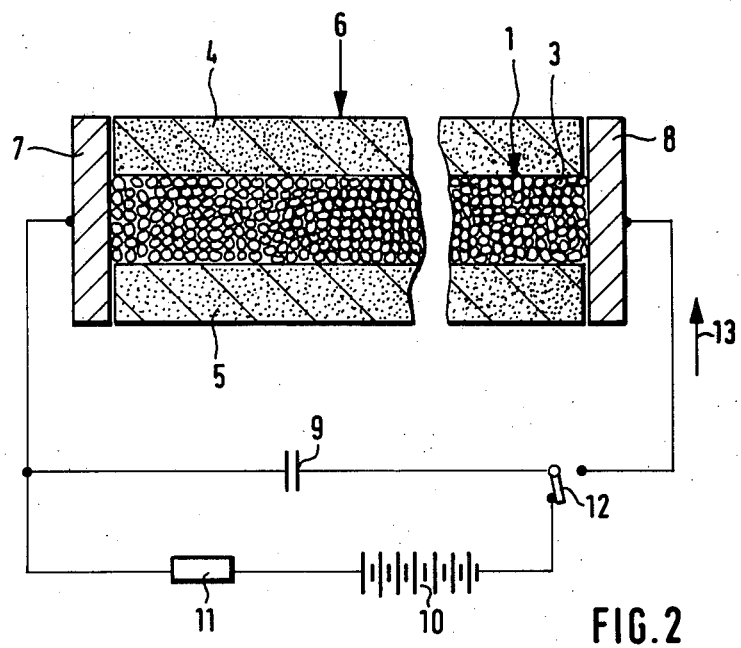

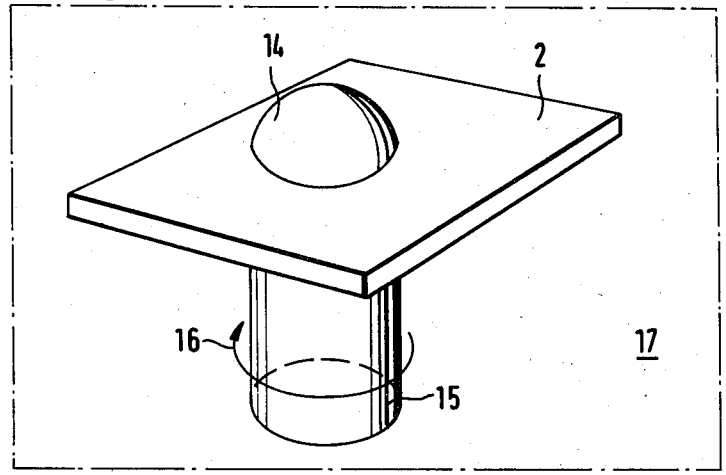
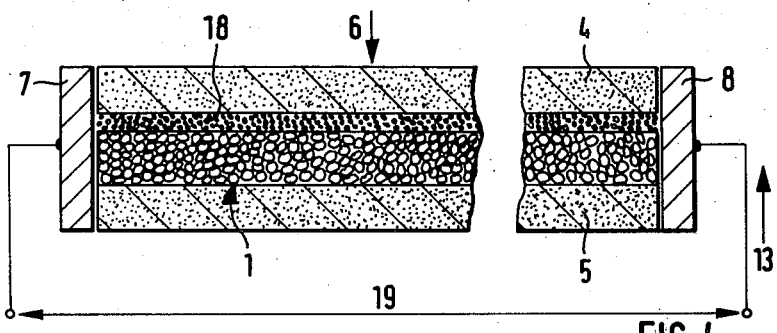
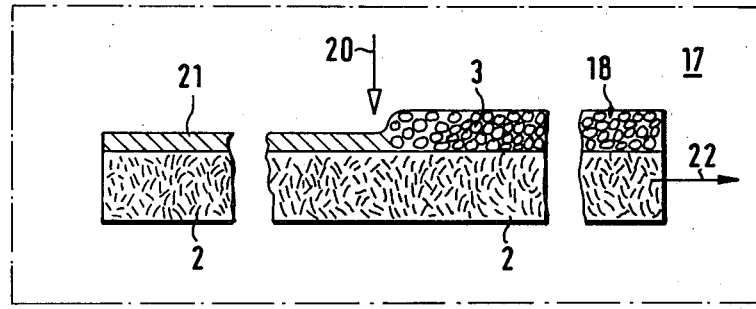

SILICON LAYER SOLAR CELL AND METHOD OF PRODUCING IT

BACKGROUND OF THE INVENTION

This invention relates to a silicon layer solar cell and a method of producing it.

Silicon solar cells designed to convert the sun's energy into electricity are becoming increasingly important technologically. Any further reduction in manufacturing costs will extend the range of application of silicon solar cells still further.

One decisive step towards reducing manufacturing costs is the polycrystalline silicon solar cell. With the polycrystalline silicon solar cell, costs of the silicon raw material can be reduced substantially. Since only an approximately 100 microns thick polycrystalline silicon layer is required for electrical operation of the silicon solar cell, it is possible to apply this approximately 100 microns thick silicon layer to a suitable substrate and to manufacture a silicon solar cell in a manner known per se in this way. Tests with silicon layers on stainless steel substrates are known from "Material Engineering", October 1979, page 6 and tests using silicon layers on carbon are known from "VDI-Nachrichten", No. 34, Aug. 22, 1980, page 6. It is also possible to use substrates comprising very low resistance silicon (produced by normal metallurgical techniques for producing solid metal). Unfortunately, metallurgical silicon has two disadvantages as a substrate material: it can only be formed into substrates at substantially high costs (as compared to carbon or metals, for example) and it usually contains shrinkage cavities which are highly disruptive.

SUMMARY OF THE INVENTION

It is an object of the invention to provide a silicon solar cell which does not have the disadvantages of known polycrystalline silicon layer solar cells.

According to a first aspect of the invention, there is provided a silicon layer solar cell comprising a low resistance silicon substrate produced by powder metallurgy and an active silicon layer applied thereto.

Further according to this aspect of the invention, there is provided a silicon layer solar cell in which the active silicon layer of the solar cell is applied to a low resistance silicon substrate wherein at least the silicon substrate is manufactured by means of powder metallurgy.

According to a second aspect of the invention, there is provided a method of producing a silicon layer solar cell comprising forming a low resistance silicon substrate by powder metallurgy and applying an active silicon layer to said silicon substrate.

BRIEF DESCRIPTION OF THE DRAWINGS

The invention will now be described in greater detail by way of example, with reference to the drawings, in which:

FIG. 1a shows a compacted silicon powder member;

FIG. 1b shows a sintered or fused substrate;

FIG. 2 shows sintering or fusing of a compacted silicon powder element with the aid of a capacitor surge current;

FIG. 3 shows schematically how a silicon layer is centrifuged onto a rotating silicon substrate;

FIG. 4 shows how a compacted powder member and a powder layer are simultaneously fused into a substrate and an active silicon layer respectively; and, FIG. 5 shows how a silicon powder layer is fused onto a moving silicon substrate using focussed light.

DESCRIPTION OF THE PREFERRED EMBODIMENTS

Basically the invention proposes a silicon layer solar cell in which the active layer is applied to a low resistance silicon substrate, and in which at least the silicon substrate is produced by means of powder metallurgy.

The silicon powder is formed into a suitable compacted member which is sintered or fused at a sufficiently high temperature. The compacted powder member may be sintered or melted in a furnace with an inert gas atmosphere or in a vacuum furnace. Since silicon has a low viscosity at its fusion point, it is advisable that the compacted powder be sintered or fused by means of a short term electrical surge current by which the required temperature is produced in a short time in accordance with Joule's law. The compacted powder member may also be sintered or fused while under simultaneous mechanical pressure in order to produce a very uniform sintering process. Highly intensive electron irradiation or irradiation with electromagnetic rays such as focussed light or laser rays, for example, is particularly suitable for sintering or fusing the compacted powder member.

The compacted silicon powder member may be produced by pressing together mechanically a suitable silicon powder at a sufficiently high pressure without any adhesive. However, the member may also be formed out of silicon powder with the aid of a liquid or a meltable adhesive. The use of an extrusion press is particularly suitable for mass-producing compacted powder members according to such a process. The silicon for the extruded silicon powder element of the substrate is preferably metallurgical silicon which can be obtained with a 98–99% purity at prices of between DM2,500 and DM3000 per ton. The silicon for the compacted powder element of the substrate may also contain aluminum or iron impurities of up to 30% by weight. As a result, a sintered member may be manufactured with a fusion temperature which is slightly lower than the fusion temperature of technical grade silicon.

The active silicon layer for producing the actual solar cell may be applied to the sintered or fused silicon substrate by chemical deposition of pure silicon from the gas phase. Methods of epitaxial and pyrolytic deposition from the gas phase which are known per se may also be used. However, it is also possible to apply a drop of pure liquid silicon on to the silicon substrate while the substrate rotates at a sufficiently high speed about an axis perpendicular to its surface. As a result of this rotation, the liquid silicon is distributed uniformly over the surface of the substrate by centrifugal forces before it solidifies. The active silicon layer may be applied in a manner known per se by vapor deposition in a high vacuum, by plasma sputtering, or by plasma jet. It is also possible to apply the silicon layer to the substrate initially in powder form and then to melt the powder. The silicon layer may be manufactured as a compacted powder member together with the silicon substrate, said compacted powder member being sintered or fused on by short term heating. The active silicon layer on the substrate can be transformed into a solar cell by a diffusion process, by ion implantation or by coating with thin metal or semi-conductor layers, and by subsequent contacting processes.

Referring now to the drawings, several embodiments will be described.

EMBODIMENT 1

FIG. 1a shows a compacted silicon powder member 1, which is produced by pressing granules 3 of silicon powder together.

FIG. 1b shows the silicon substrate 2 in cross-section, the substrate 2 being formed by sintering or fusing the compacted silicon powder member 1.

EMBODIMENT 2

In FIG. 2, 1 is a compacted silicon powder element which is maintained under high pressure 6 between a ceramic pressure die 4 and a ceramic base plate 5. 7 and 8 are electrically conductive pressure contacts by means of which an electrical surge current 13 flows from the capacitor 9 through the compacted silicon powder element 3. The capacitor 9 is charged by an electrical charging resistance 11 and a switch 12 from a dc battery 10.

EMBODIMENT 3

In FIG. 3 a silicon substrate 2 rotates about an axis 15 at a speed 16. A drop 14 of liquid silicon is located in the center of the rotating substrate 2 and is distributed uniformly over the surface of the substrate 2 by the centrifugal force generated by the rotation. The arrangement is located in an oxygen-free chamber 17.

EMBODIMENT 4

A compacted silicon powder element 1 together with an overlying silicon powder layer 18 are compressed under pressure 6 between the ceramic pressure die 4 and the ceramic base plate 5. The electrical surge current 13 from the surge current source 19 flows through the electrically conductive pressure die 7 and 8 through the compacted silicon member 1. The compacted silicon member 1 is heated for a very short time until it is above its fusion temperature, so that the powder layer 18 also melts. The silicon member solidifies under the pressure 6.

EMBODIMENT 5

In FIG. 5 a silicon substrate 2 which is coated on one side with a silicon powder layer 18 undergoes movement 22. The silicon in the irradiation region is fused by a focussed light beam 20 so that the powder layer 18 comprising powder granules 3 is converted into the silicon layer 21. The arrangement is located in a chamber 17 with inert gas or in a vacuum.

It will be understood that the above description of the present invention is susceptible to various modification changes and adaptations.

What is claimed is:

1. A method of producing a silicon layer solar cell having an active silicon layer applied to a surface of a low resistance silicon substrate, said method comprising: forming a low resistance silicon substrate using powder metallurgy by producing a compacted silicon powder member, and sintering or fusing the compacted silicon powder member at a sufficiently high temperature by passing an electrical current through the compacted silicon powder member; and applying an active silicon layer to a surface of the said silicon substrate.

2. A method of producing a silicon layer solar cell as defined in claim 1, wherein said electrical current is a short term electrical surge current which is passed through the compacted powder member.

3. A method of producing a silicon layer solar cell as defined in claim 1, further comprising maintaining the compacted powder member under mechanical pressure during the time it is being sintered or fused.

4. A method of producing a silicon layer solar cell as defined in claim 1, wherein the compacted powder member is produced by pressing silicon powder together mechanically.

5. A method of producing a silicon layer solar cell as defined in claim 1, wherein the compacted powder member is formed from silicon powder using a liquid or a meltable adhesive.

6. A method of producing a silicon layer solar cell as defined in claim 1, wherein the compacted powder member is produced by an extrusion process.

7. A method of producing a silicon layer solar cell as defined in claim 1, wherein a silicon powder made of metallurgical silicon is used.

8. A method of producing a silicon layer solar cell as defined in claim 7 wherein said silicon powder contains up to 30% by weight aluminium or iron.

9. A method of producing a silicon layer solar cell as defined in claim 1, wherein said active silicon layer is applied to said surface of the silicon substrate by chemical deposition from the gas phase.

10. A method of producing a silicon layer solar cell as defined in claim 1, wherein said active silicon layer is applied to said surface of the silicon substrate by centrifuging liquid silicon onto said surface of said silicon substrate.

11. A method of producing a silicon layer solar cell as defined in claim 1, wherein said active silicon layer is applied to said surface of the silicon substrate by vapor or plasma jet deposition.

12. A method of producing a silicon layer solar cell as defined in claim 1, wherein said active silicon layer is applied to said surface of the silicon substrate in powder form and is then melted thereon.

13. A silicon layer solar cell produced according to the method of claim 1.

14. A method of producing a silicon layer solar cell having an active layer formed on a surface of a low resistance silicon substrate, said method comprising: forming a substrate member of compacted silicon powder; applying a thin layer of silicon powder, which is to serve as the active layer in the completed solar cell, to a surface of the substrate member; applying pressure to the powder layer and the substrate member to compact the powder layer; and sintering and fusing the silicon powder of the substrate member and of the thin layer by passing a short term electrical surge current through the compacted silicon powder substrate member and through the thin silicon powder layer while maintaining said pressure.

15. A silicon layer solar cell produced according to the method of claim 14.

16. A silicon solar cell produced according to the method of claim 8.

* * * * *